(12) United States Patent
Bamiere et al.

(10) Patent No.: US 8,110,121 B2
(45) Date of Patent: Feb. 7, 2012

(54) LEAD ZIRCONATE TITANATE WITH IRON/TUNGSTEIN DOPING, METHOD OF PRODUCING A PIEZOCERAMIC MATERIAL WITH THE LEAD ZIRCONATE TITANATE, AND USE OF THE PIEZOCERAMIC MATERIAL

(75) Inventors: Francois Bamiere, Mannheim (DE); Katrin Benkert, München (DE); Stefan Denneler, München (DE); Morgane Radanielina, Strasbourg (FR); Carsten Schuh, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 732 days.

(21) Appl. No.: 12/094,186

(22) PCT Filed: Dec. 19, 2006

(86) PCT No.: PCT/EP2006/069888
§ 371 (c)(1),
(2), (4) Date: May 19, 2008

(87) PCT Pub. No.: WO2007/074107
PCT Pub. Date: Jul. 5, 2007

(65) Prior Publication Data
US 2008/0282536 A1    Nov. 20, 2008

(30) Foreign Application Priority Data
Dec. 22, 2005   (DE) .......................... 10 2005 061 528

(51) Int. Cl.
C04B 35/00     (2006.01)
C04B 35/495    (2006.01)
H01L 41/187    (2006.01)
H01L 41/18     (2006.01)

(52) U.S. Cl. ............................. 252/62.9 PZ; 252/62.9 R

(58) Field of Classification Search ............. 252/62.9 R, 252/62.9 PZ
See application file for complete search history.

(56) References Cited

U.S. PATENT DOCUMENTS

| | | | | |
|---|---|---|---|---|
| 3,994,935 | A | | 11/1976 | Varma et al. ................ 260/397.3 |
| 4,675,123 | A | * | 6/1987 | Tsunooka et al. ........ 252/62.9 R |
| 4,917,810 | A | * | 4/1990 | Tsunooka et al. ........ 252/62.9 R |
| 5,169,551 | A | * | 12/1992 | Tsunooka et al. ........ 252/62.9 R |
| 6,391,814 | B1 | | 5/2002 | Tsubokura et al. ............ 501/136 |
| 6,440,324 | B1 | | 8/2002 | Hayashi et al. .............. 252/62.9 |
| 6,773,621 | B2 | | 8/2004 | Hammer et al. ............. 252/62.9 |
| 6,972,060 | B2 | | 12/2005 | Yasuda et al. .............. 156/89.14 |
| 2003/0168624 | A1 | | 9/2003 | Hammer et al. ............. 252/62.9 |
| 2003/0188820 | A1 | | 10/2003 | Yasuda et al. .............. 156/89.12 |

FOREIGN PATENT DOCUMENTS

| | | |
|---|---|---|
| DE | 2653406 | 11/1976 |
| DE | 4416246 | 5/1994 |
| DE | 10041905 | 8/2000 |
| DE | 10315464 | 4/2003 |
| EP | 0928034 | 9/1996 |
| WO | 02055450 | 7/2002 |

OTHER PUBLICATIONS

Nakaki. Enhancement of Polarization Property of PZT Film by Ion-Substitution Using Rare-Earth Elements. JJAP. vol. 44 No. 9, 2005 6905-6909.*
International Search Report; PCT/EP2006/069888; pp. 3, Apr. 4, 2007.

* cited by examiner

*Primary Examiner* — Carol M Koslow
*Assistant Examiner* — Matthew Hoban
(74) *Attorney, Agent, or Firm* — King & Spalding L.L.P.

(57) ABSTRACT

A piezoceramic composition has a nominal empirical formula of $Pb_{1-a}RE_bAE_c[Zr_xTi_y(Fe_fW_w)_z]O_3$. RE is a rare earth metal with a fraction b and AE is an alkaline earth metal with a fraction c. Iron is present with an iron fraction f·z, and tungsten with a tungsten fraction w·z. In addition, the following relationships apply: $a<1$; $0=b=0.15$; $0=c=0.5$; $f>0$; $w>0$; $0.1=f/w=5$; $x>0$; $y>0$; $z>0$ and $x+y+z=1$. A method of producing a piezoceramic material using the piezoceramic composition has the steps: a) provision of a green ceramic body with the piezoceramic composition, and b) heat treatment of the green body, a piezoceramic of the piezoceramic material being produced from the piezoceramic composition. The heat treatment encompasses calcining and/or sintering. The piezoceramic composition undergoes compaction at below 1000° C. Metals which melt at low temperature (such as silver or a silver-palladium alloy with a low palladium content, for example) can therefore be sintered together with the piezoceramic composition.

9 Claims, 2 Drawing Sheets

LEAD ZIRCONATE TITANATE WITH IRON/TUNGSTEIN DOPING, METHOD OF PRODUCING A PIEZOCERAMIC MATERIAL WITH THE LEAD ZIRCONATE TITANATE, AND USE OF THE PIEZOCERAMIC MATERIAL

CROSS-REFERENCE TO RELATED APPLICATIONS

This application is a U.S. national stage application of International Application No. PCT/EP2006/069888 filed Dec. 19, 2006, which designates the United States of America, and claims priority to German application number 10 2005 061 528.7 filed Dec. 22, 2005, the contents of which are hereby incorporated by reference in their entirety.

TECHNICAL FIELD

The invention relates to a piezoceramic composition having a nominal empirical formula of a lead zirconate titanate (PB(Ti,Zr)$O_3$, PZT). In addition a method for producing a piezoceramic material using the piezoceramic composition and a use of the piezoceramic material are specified.

BACKGROUND

Lead zirconate titanate is a perovskite in which the A-sites of the perovskite are occupied by bivalent lead ($Pb^{2+}$) and the B-sites of the perovskite by quadrivalent zirconium ($Zr^{4+}$) and quadrivalent titanium ($Ti^{4+}$). To influence an electrical or piezoelectrical characteristic such as permittivity, Curie temperature, coupling factor or piezoelectric charge constant (for example $d_{33}$ coefficient) PZT doping is used.

A piezoceramic material in the form of a monolithic multilayer actuator is known from EP 0 894 341 B1. The multilayer actuator consists of a plurality of piezo elements arranged one above the other to form a monolithic stack. Each of the piezo elements forms an electrode layer, a further electrode layer and piezoceramic layers arranged between the electrode layers. Piezo elements adjacent to each other in the stack have a common electrode layer in each case. The electrode material of the electrode layers consists of a silver-palladium alloy. The piezoceramic layers have a piezoceramic made of PZT. The nominal empirical formula of the piezoceramic is $PB_{0.99}Ag_{0.01}LA_{0.01}$ $[Zr_{0.30}Ti_{0.36}(Ni_{1/3}Nb_{2/3})_{0.34}]O_3$. This PZT with nickel and niobium has a complex B-site doping.

To produce the multilayer actuator, powdered oxidic metal compounds are mixed to form a piezoceramic composition with the formal empirical formula $PB_{0.99}LA_{0.01}$ $[Zr_{0.30}Ti_{0.36}(Ni_{1/3}Nb_{2/3})_{0.34}]O_{3.005}$. The piezoceramic composition consists of a mixture of powered metal oxides. This mixture is worked in a molding process into ceramic green tapes. The ceramic green tapes are printed with an electrode material made from a silver-palladium alloy with a palladium fraction of around 30% by weight. The printed green tapes are stacked one above the other, debound and sintered. During sintering the piezoceramic layers with the piezoceramic are produced from the green tapes with the piezoceramic composition. The electrode layers (inner electrodes) are produced from the electrode materials printed onto the green tapes. The monolithic multilayer actuator is produced by the common sintering of the piezoceramic layers and the electrode layers (cofiring).

The composition of the piezoceramic of the resulting piezoceramic layers is stoichiometric. The stoichiometry is produced by surplus lead escaping during sintering in the form of lead oxide (PbO). Surplus available heterovalent Lanthanum is compensated for by building in silver of the electrode material at the A-sites of the PZT.

The resulting multilayer actuator has outstandingly good piezoelectric characteristics. For example the Curie temperature $T_c$ amounts to around 170° C. However the sinter temperature to obtain the good piezoelectric characteristics lies at over 1100° C. To avoid the electrode material melting at these high sinter temperatures the fraction of the electrode material by weight of palladium must be at least 30%.

For reasons of cost it is desirable to lower the fraction of palladium in the electrode material or in general to use cheaper electrode material such as copper or silver. These metals each have a melting point of below 1100° C. This means that the sinter temperature must be lowered.

The known piezoceramic composition is not suitable for compaction at a sinter temperature of below 1100° C. At such a low sinter temperature the improved piezoelectric characteristics are not achieved.

SUMMARY

A piezoceramic composition can be specified which compacts at a sinter temperature of below 1100° C. and which can be worked into a piezoceramic material which has similar or better piezoelectric characteristics when compared to the prior art.

According to an embodiment, a piezoceramic composition may have a nominal empirical formula $PB_{1-a}RE_bAE_c[Zr_xTi_y(Fe_fW_w)_z]O_3$, wherein RE being a rare earth metal with a rare earth metal fraction b, AE being an alkaline earth metal with an alkaline earth metal fraction c, iron with an iron fraction f being present, tungsten with a tungsten fraction w being present, and the following relationships applying: $a<1$, $0 \leq b \leq 0.15$, $0 \leq c \leq 0.5$, $f>0$, $w>0$, $0.1 \leq f/w \leq 5$, $x>0$, $y>0$, $z>0$, $x+y+z=1$.

According to a further embodiment, the following may apply: $0.5 \leq f/w \leq 4$. According to a further embodiment, the following may apply: $f/w=3$. According to a further embodiment, the following may apply: $f=0.75$, and $w=0.25$. According to a further embodiment, the following may apply: $0.1 \leq c \leq 0.5$. According to a further embodiment, the following may apply: $0.005 \leq b \leq 0.15$. According to a further embodiment, the following may apply: $0.001 \leq z \leq 0.05$. According to a further embodiment, the rare earth metal RE may be at least one metal selected from the group consisting of europium, gadolinium, lanthanum, neodymium, praseodymium, promethium and samarium. According to a further embodiment, the alkaline earth metal AE may be at least a metal selected from the group consisting of calcium, strontium and barium.

According to another embodiment, a method for producing such a piezoceramic material may comprise the steps:
a) Provision of a green body with the piezoceramic composition and
b) Heat treatment of the green body, with a piezoceramic of the piezoceramic material being produced from the piezoceramic composition.

According to a further embodiment, for provision of the green body, a mixing of powdered, oxidized metal compounds of the metals lead, rare earth metal RE, alkaline earth metal AE, zirconium, titanium, iron and tungsten may be undertaken for piezoceramic composition. According to a further embodiment, a piezoceramic composition with at least one mixed oxide with at least two of the metals may be used. According to a further embodiment, a piezoceramic material with at least one piezo element may be produced, which comprises an electrode layer with electrode material, at least one further electrode layer with a further electrode material and at least one piezoceramic layer arranged between the electrode layers with the piezoceramic. According to a further embodiment, a piezo element may be used in which the electrode material and/or the further electrode material comprises at least one elementary metal selected from the group consisting of silver, copper and palladium. According to a further embodiment, a piezo element may be used, in which the electrode material and/or the further electrode material have a fraction of palladium which is selected from the range of 0% to 30% by weight inclusive and especially from the range of 0% to 20% by weight inclusive. According to a further embodiment, a palladium fraction of maximum 5% by weight may be used. According to a further embodiment, the piezoceramic material with the piezo element may be selected from the group consisting of piezoceramic bending transducer, piezoceramic multilayer actuator, piezoceramic transformer, piezoceramic motor and piezoceramic ultrasound converter.

According to yet another embodiment, a method may use a piezoceramic multilayer actuator produced in accordance with any of the above described methods for activation of a fuel injection valve of an internal combustion engine.

BRIEF DESCRIPTION OF THE DRAWINGS

The invention will be explained in greater detail below with reference to a number of examples and the associated figures. The figures are schematic and do not represent true-to-scale illustrations.

DETAILED DESCRIPTION

Figure 1:
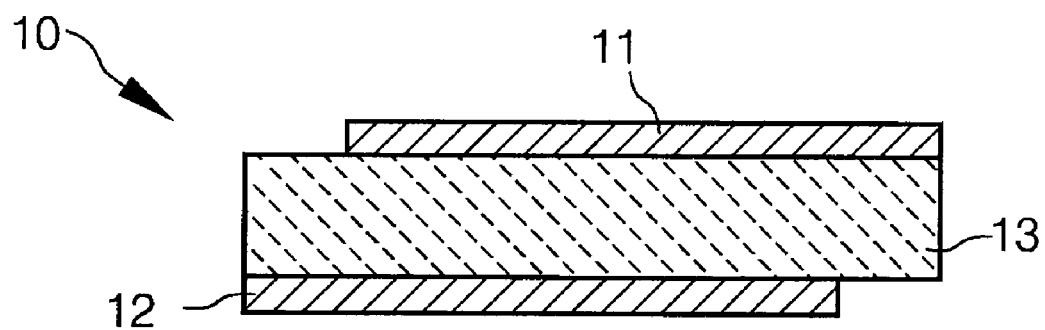
FIG. 1 shows a ceramic piezo element with a piezoceramic which was produced with the piezoceramic composition, viewed in cross-section from the side.
Figure 2:
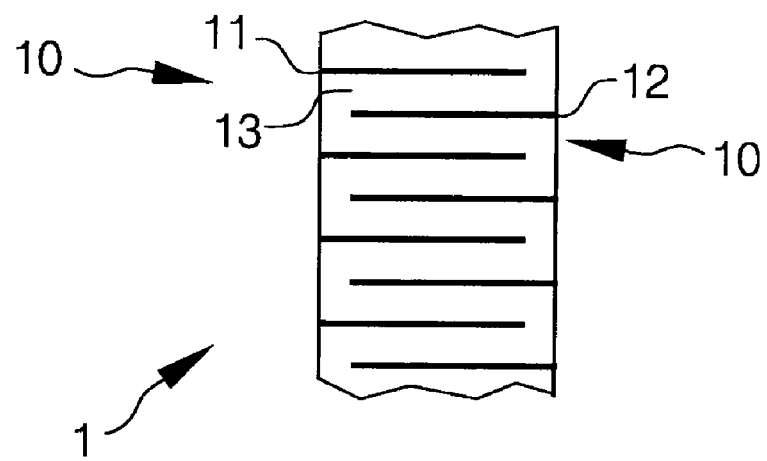
FIG. 2 shows a piezoceramic material with a plurality of piezo elements, viewed from the side in cross-section.

According to an embodiment, a piezoceramic composition with a nominal empirical formula $PB_{1-a}RE_bAE_c[Zr_xTi_y(Fe_fW_w)_z]O_3$ may be specified. In this case RE is a rare earth metal with a rare earth metal fraction b and AE an alkaline earth metal with an alkaline earth metal fraction c. Iron is present with an iron faction of $f \cdot z$ and tungsten with a tungsten fraction $w \cdot z$. In addition the following relationships apply:

$a<1$ $0 \leq b \leq 0.15$ $0 \leq c \leq 0.5$ $f>0$ $w>0$ $0.1 \leq f/w \leq 5$ $x>0$ $y>0$ $z>0$ $x+y+z=1$.

The specified fractions are molar fractions. f/w specifies the ratio of the molar fractions of iron and tungsten.

According to another embodiment, a method for producing a piezoceramic material using the piezoceramic composition, may comprise the following method steps: a) Provision of a green body with the piezoceramic composition and b) heat treatment of the green body, with a piezoceramic of the piezoceramic material being produced from the piezoceramic composition. The green body is a molded body, which consists for example of homogeneous mixed oxides of the specified metals pressed together. The green body can likewise feature an organic additive which is processed with the oxides of the metals into a slurry. The organic additive is for example a binder or a dispersant. A green body, in the form of a green tape for example, is produced from the slurry by drawing the ceramic sheets. The green body with the piezoceramic composition produced during the molding process is subjected to a heat treatment. The heat treatment of the green body includes a calcination and/or a sintering. The result is shaping and compacting the piezoceramic which forms. Lead oxide escapes during compaction. Lead with a stoichiometric lead surplus of up to 0.1 (10 mol %) is thus added.

According to various embodiments, a lead zirconate titanate with complex B-site doping with iron and tungsten is able to be compacted at a relatively low sinter temperature. The formation and the compaction of the piezoceramic take place from even below 900° C. to 1000° C. The piezoceramic thus exhibits an outstanding grain growth even at such a low sinter temperature. In large grains from the piezoceramic domain switching is practically unimpeded. The piezoceramic therefore also exhibits good piezoelectric characteristics with high large signal values. For example the $d_{33}$ coefficient amounts to appr. 700 pm/V at an electrical field strength of 2 kV/mm. The Curie temperature $T_c$ lies above 300° C. for example.

It is assumed that during the sintering process a melting eutectic phase from lead oxide and tungsten oxide ($PbO \cdot WO_3$) forms intermediately at a low temperature (appr. 730° C.). This eutectic phase can favorably affect the sintering of the piezoceramic (melt phase-supported sintering). During the sintering this phase dissolves almost completely. The result is an almost single-phase piezoceramic with the piezoceramic composition.

In principle any given ratio of the fraction or iron and the fraction of tungsten is conceivable. Preferably the following applies: $0.5 \leq f/w \leq 4$. In a particular embodiment f/w=3 then applies. The ratio of the iron fraction and of the tungsten fraction essentially amounts to 3. In this case a deviation of 10% ($2.7 \leq f/w \leq 3.3$) through to 20% ($2.4 \leq f/w \leq 3.6$) is possible. Beyond the effect described above of the intermediately occurring liquid phase the grain growth is namely explicitly favored by avoiding empty spaces in the PZT grid. The doping of the PZTs with acceptor ions such as $Fe^{2+}$ or $Fe^{3+}$ brings about the formation of the oxygen spaces. The doping of the PZT with donator ions such as W leads to lead spaces. Such spaces are grid defects which hamper the mobility of the grain boundaries and thus hinder the grain growth in the sinter process. By explicitly adding the doping ions, especially the iron and tungsten ions, almost exactly as many oxygen spaces as lead spaces can be formed. Because of the different leading charge signs the oxygen spaces and the lead spaces compensate for each other. The piezoceramic has fewer empty spaces. The grain growth in the sinter process is favorably affected.

Preferably the fraction of iron amounts to around $z \cdot 0.75$ and the fraction of tungsten to around $z \cdot 0.25$. The following applies: f=0.75 and w=0.25. Here too deviations of 10% through to 20% respectively are possible. With this fraction of iron and the fraction of tungsten adapted to it an especially low sinter temperature with relatively good piezoelectric characteristics of the resulting piezoceramic material can be achieved.

It is especially advantageous if the alkaline earth metal AE is present, i.e., the fraction of alkaline earth metal c is not equal to 0. The presence of alkaline earth metals promotes the grain growth of the piezoceramic which is forming. On average larger piezoceramic grains are obtained during sintering. This enables the piezoceramic characteristics to be improved. In accordance with a particular embodiment the following than applies for the alkaline earth fraction c: $0.005 \leq c \leq 0.1$. The alkaline earth metal is a metal selected from at least one of the group calcium, strontium and barium. In such cases only one type of alkaline earth metal can be present. Also conceivable are a number of types of alkaline earth metals, for example strontium and barium.

In respect of good piezoceramic characteristics a small fraction of the A-sites of the piezoceramic forming are occupied by one or more rare earth metals RE. The rare earth fraction b amounts to below 15 mol % ($b \leq 0.15$). In particular b is selected to range between 0.005 and 0.15. Any given element of the lanthanide or actinide group can be used here as a rare earth metal. In an especial embodiment the rare earth metal RE is selected from at least one of the group of metals europium, gadolinium, lanthanum, neodymium, praseodymium, promethium and samarium. These rare earth metals lead with the specified low rare earth metal fraction c to a relatively high $d_{33}$ coefficient in the small signal area (with electrical field strengths of few V/mm) and also in the large signal area (with electrical field strengths of a few kV/mm).

The following then applies for the complex B-site doping: $x+y+z=1$. It has turned out to be especially advantageous in such cases for the iron/tungsten fraction z to be below 0.05, i.e. below 5 mol %. Preferably the iron-tungsten fraction z lies under 0.03 and especially under 0.02. The following relationships apply: $0.001 \leq z \leq 0.03$ and especially $0.001 \leq z \leq 0.02$. With higher iron-tungsten fractions melt phases (glass phases) for example from lead oxide and tungsten oxide ($PbO.WO_3$) can occur to a significant extent during the sinter process. This leads to a disturbance of a structure of the piezoceramic being formed. There is a negative effect on the characteristic values of the piezoceramic.

For provision of the green body with the piezoceramic composition preliminary stages of the oxides of the metals, for example carbonate or oxalate, can be used. Preferably however oxides of the metals are used directly. Both types of metal compounds, i.e. the preliminary stages of the oxide as well as the oxide itself, can be referred to as oxidic metal compounds.

In an especial embodiment, to provide the green body, a mixing of powdered, oxidic metal compounds of the metals lead, rare earth metal RE, alkaline earth metal AE, zirconium, titanium, iron and tungsten can be undertaken for piezoceramic composition. To produce the piezoceramic material the oxidic metal compounds are used as a powder. These oxidic metal compounds are preferably lead oxide (PbO), rare earth oxide (e.g. $LA_2O_3$, $Nd_2O_3$, $Gd_2O_3$), alkaline earth oxide (e.g. CaO or SrO), zirconium dioxide ($ZrO_2$), titanium dioxide ($TiO_2$), iron oxide ($Fe_2O_3$) and tungsten trioxide ($WO_3$).

The powder of the oxidic metal compounds can be produced in accordance with known methods, for example using precipitation reactions according to the sol-gel, the citrate, the hydrothermal or the oxalate method. In such cases oxidic metal compounds with only one type of metal can be produced. It is especially also conceivable for oxidic metal compounds with a number of different types of metals to be used (mixed oxide). In accordance with a particular embodiment a piezoceramic composition with at least one oxidic metal compound with at least two of the metals will thus be used. The oxidic metal compound with at least two of the metals is for example a lead zirconate titanate (Zr, $TiO_2$). Here too there can be reference back to the above-mentioned precipitation reactions. A mixed-oxide method is also conceivable. In such cases powdered oxides of different metals are mixed with each other and calcinated at high temperatures. The mixed oxide is produced during calcination.

The preparation of the metal oxide with the transfer into the piezoceramic material can be undertaken in various ways. It is conceivable for example for the powder of the oxidic metal compounds to first be mixed homogeneously. The piezoceramic composition in the form of a homogeneous mixture of the metal oxides is produced. Subsequently the piezoceramic composition is converted by heat treatment, e.g. by calcination, into the piezoceramic. The piezoceramic is crushed into fine piezoceramic powder. Subsequently a ceramic green body with an organic binder is produced in a molding process from the fine piezoceramic powder. This ceramic green body is unbound and sintered. In such cases the piezoceramic material is formed with the piezoceramic.

As an alternative to the method described the powder of the oxidic metal compounds can be mixed homogeneously and worked in the molding process into a ceramic green body with organic binder. This green body too already exhibits the piezoceramic composition. Subsequent sintering leads to the piezoceramic material.

In accordance with a particular embodiment a piezoceramic material with at least one piezo element is produced, which features an electrode layer with electrode material, at least one further electrode layer with a further electrode material and at least one piezoceramic layer arranged between the electrode layers with the piezoceramic. A single piezo element represents the smallest unit of a piezoceramic component. To produce the piezo element for example a ceramic green tape with the piezoceramic composition is printed on both sides with the electrode materials. The piezo element is the result of subsequent debinding and sintering.

The piezoceramic composition compacts at relatively low sinter temperatures. It is thus possible to use elementary metals which have relatively low melt temperatures as electrode material. In accordance with a particular embodiment a piezo element is thus used, in which the electrode material and/or the further electrode material feature at least one elementary metal selected from the group silver, copper and palladium. The piezoceramic material of the piezo element is especially produced by a common sintering of the piezoceramic composition and of the electrode material (cofiring). The electrode material can in this case consist of the pure metals, of only silver for example (melt temperature appr. 960° C.) or only copper (melt temperature appr. 1080° C.). An alloy of said metals is likewise possible, for example an alloy of silver and palladium. In particular the electrode material and/or the further electrode material have a fraction of palladium which is selected from the range between 0% by weight to 30% by weight inclusive. Preferably the fraction of palladium is a maximum 20% by weight. 0 in this case means that almost no palladium is present. Small fractions of palladium of up to 0.5% by weight are however possible. The reduction of the fraction of palladium lowers the melt temperature of the silver-palladium alloy. For example the melt temperature of the allow for a fraction of palladium of 20% by weight is around 1100° C. Preferably the fraction of palladium amounts to maximum 5% by weight. (melt temperature around 1000° C.). The lower fraction of palladium means that costs for manufacturing such components are likewise greatly reduced. Simultaneously however the compaction at low temperatures gives access to a piezoceramic with good piezoelectric characteristics.

The sintering into piezoceramic material can be undertaken in both a reducing and an oxidizing sinter atmosphere. In a reducing sinter atmosphere almost no oxygen is present. An oxygen partial pressure amounts to less than $1 \cdot 10^{-2}$ mbar and preferably less than $1 \cdot 10^{-3}$ mbar. Sintering in a reducing sinter atmosphere allows low-cost copper to be used as an electrode material.

Basically any piezoceramic material can be produced with the aid of the piezoceramic composition. The piezoceramic material preferably features at least one piezo element described above. Preferably the piezoceramic material is selected with the piezo element from the group piezoceramic bending transducers, piezoceramic multilayer actuators, piezoceramic transformers, piezoceramic motors and piezoceramic ultrasound converters. The piezo element is for example a component of a piezoelectric bending transducer. By stacking a plurality of green tapes printed on one side or on both sides with electrode material, subsequent debinding and sintering, a monolithic stack of piezo elements is produced. With a suitable dimensioning and form the result is a monolithic piezoceramic multilayer actuator. This piezoceramic multilayer actuator is preferably used for activation of a fuel injection valve of an internal combustion engine. The stack-type arrangement of the piezo element also means that, with suitable dimensioning and form, a piezoceramic ultrasound converter is accessible. The ultrasound converter is for example used in medical engineering or for materials testing.

In summary the following advantages are provided:

The complex B-site doping with iron and tungsten mean that the piezoceramic composition compacts even at below 1000° C.

Because of the compaction occurring at lower temperatures, relatively low sinter temperatures are available.

The low sinter temperatures open up the opportunity of using metals or alloys which melt at a lower temperature as electrode material in the production process of piezoceramic materials. This produces cost savings by comparison with the current prior art.

The A-site doping with the rare earth metals means that good piezoelectric characteristics of the resulting piezoceramic material are obtained.

By alkaline earth ions, which principally occupy the A-sites of the resulting piezoceramic, the good piezoelectric characteristics can be additionally improved.

Figure 4:
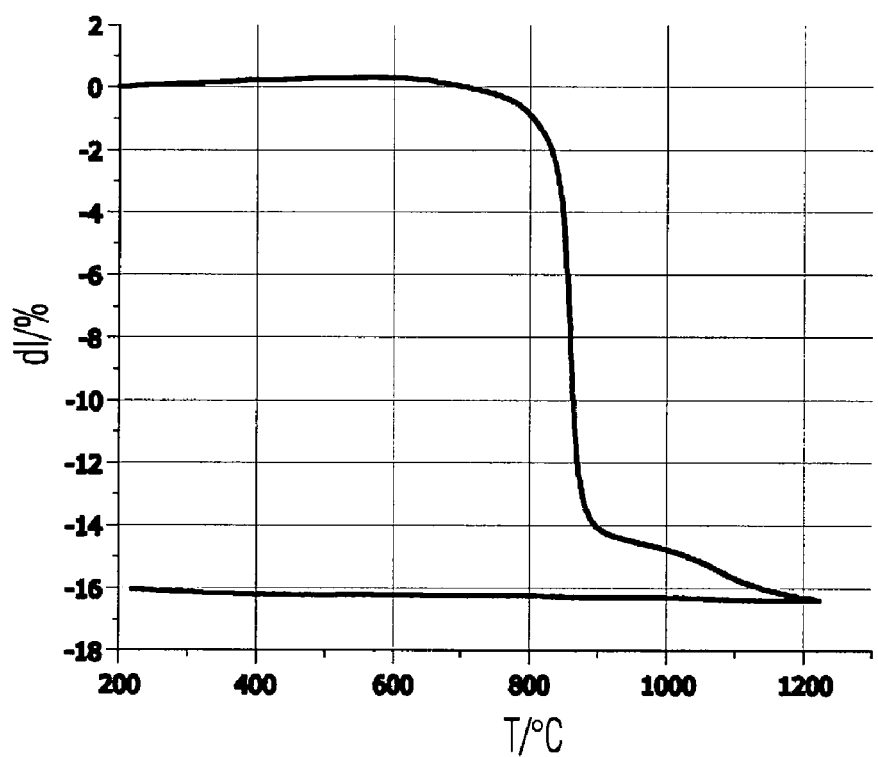
FIG. 4 shows the shrinkage behavior during sintering of one of the piezoceramic compositions.

In accordance with a first exemplary embodiment the piezoceramic composition I has the following nominal composition: $PB_{1.01}Gd_{0.01}[(Zr_{0.525}Ti_{0.475})_{0.98}(Fe_{0.75}W_{0.25})_{0.02}]O_3$. The shrinkage behavior of this composition can be taken from FIG. 4. In this graph a dilatometrically-measured length change dl (in %) is plotted against the temperature T (in ° C.). Even at a temperature of 800° C. a noticeable compaction occurs.

A second exemplary embodiment of the piezoceramic composition II is based on the following nominal composition: $PB_{1.00}Gd_{0.02}[(Zr_{0.545}Ti_{0.455})_{0.95}(Fe_{0.767}W_{0.233})_{0.05}]O_3$.

A third exemplary embodiment of the piezoceramic composition III has the following nominal composition: $PB_{1.02}Sr_{0.01}[(Zr_{0.525}Ti_{0.475})_{0.98}(Fe_{0.583}W_{0.417})_{0.02}]O_3$.

To produce the piezoceramic composition corresponding fractions of powdered PbO, $Gd_2O_3$, SrO, $ZrO_2$, $TiO_2$, $Fe_2O_3$ and $WO_3$ are mixed homogeneously with each other and calcinated or sintered. PbO is added in each case with a surplus of 3 mol %. During sintering the surplus fraction of lead oxide escapes.

From the piezoceramic compositions I, II and III, the sintering produces a piezoceramic in each case, of which the piezoelectric characteristics can be taken from Table 1. Listed in Table 1, as well as the $d_{33}$ values of the average grain size (average diameter of piezoceramic grains), are the Kp value (planar coupling factor), the relative permittivity $\epsilon_r$, and the Curie temperature $T_c$. The sintering lasts for between two and three hours. The sintering is undertaken in an oxidizing sinter atmosphere. The different values for I, I' and I" are produced by different sinter temperatures.

TABLE 1

|  | I | I' | I" | II | III |
|---|---|---|---|---|---|
| Sinter temperature [° C.] | 1100 | 1000 | 900 | 1100 | 1100 |
| $\epsilon_r$ (after polarization of the piezoceramic) | 1517 | 1569 | 1416 | 1616 | 1319 |
| Large signal-$d_{33}$ at 2 kV/mm [pm/V] | 743 | 700 | 643 | 689 | 702 |
| Large signal-$d_{33}$ at 1 kV/mm [pm/V] | 716 | 689 | 627 | 617 | 699 |
| Kp [%] | 55 | 61 | 57 | 46 | 59 |
| Grain size [pm] | 8-9 | 5 | 2-3 | 8-10 | 4-5 |
| $T_{Curie}$ [° C.] | 347 | 345 | 346 | 300 | 343 |

The piezoceramic composition is used for the production of a piezoceramic material 1. The piezoceramic material 1 in accordance with a first embodiment is a piezo actuator 1 of a monolithic multilayer design. The piezo actuator 1 consists of a plurality of piezo elements 10 arranged above one another in a stack. Each of the piezo elements 10 has an electrode layer 11, a further electrode layer 12 and a piezoceramic layer 13 arranged between the electrode layers 11 and 12. The adjacent piezo elements 10 in the stack each have a common electrode layer. The electrode layers 11 and 12 feature an electrode material from a silver-palladium alloy, which contains palladium at a fraction of 5% by weight. In an alternate embodiment the electrode layers consist of (almost) pure silver. In accordance with a further alternate embodiment the electrode material is copper.

Figure 3:
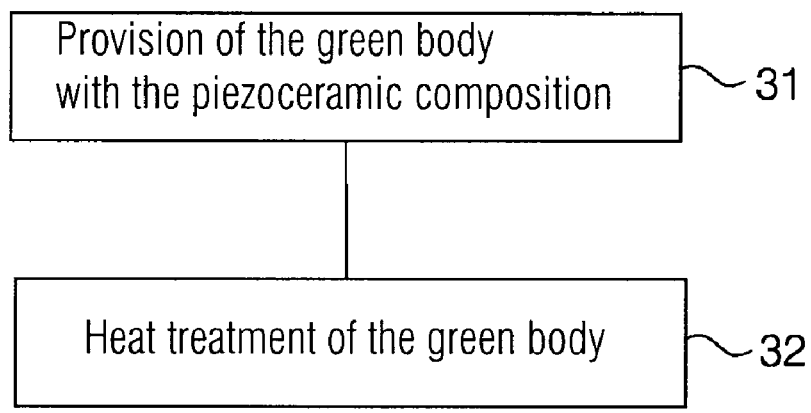
FIG. 3 shows a method for producing the piezoceramic material.

To produce the piezo actuator 1 green bodies in the form of green tapes with the piezoceramic composition are provided (method step 31, FIG. 3). To this end a powder with the piezoceramic composition is mixed with an organic binder. The ceramic green tapes are molded from the slurry obtained in this way. The green tapes are dried, printed with a paste with the electrode material, stacked above each other, laminated, debound and sintered into a piezo actuator in an oxidizing sinter atmosphere (silver or silver-palladium alloy as electrode material) or a reducing sinter atmosphere (copper as electrode material) (method step 32, FIG. 3).

The resulting monolithic piezoceramic multilayer actuator is used for actuating a fuel injection valve of an internal combustion engine of a motor vehicle.

Alternate embodiments not shown, such as a piezoceramic bending transducer, a piezoceramic transformer or a piezoceramic ultrasound converter, are likewise available with the new piezoceramic composition.

The invention claimed is:

1. A piezoceramic composition with a nominal empirical formula $PB_{1-a}RE_bAE_c[Zr_xTi_y(Fe_fW_w)_x]O_3$, wherein RE being a rare earth metal with a rare earth metal fraction b, AE being an alkaline earth metal with an alkaline earth metal fraction c, iron with an iron fraction f being present, tungsten with a tungsten fraction w being present, and the following relationships applying:

$a < 1$ $0 \leq b \leq 0.15$ $0 \leq c \leq 0.5$ $f > 0$ $w > 0$ $2.4 \leq f/w \leq 3.6$ $x > 0$ $y > 0$ $z > 0$ $x + y + z = 1$.

2. The piezoceramic composition according to claim 1, wherein:

$2.7 \leq f/w \leq 3.3$.

3. The piezoceramic composition according to claim 2, wherein:

$f/w = 3$.

4. The piezoceramic composition according to claim 3, wherein:

$f = 0.75$, and $w = 0.25$.

5. The piezoceramic composition according to claim 1, wherein:

$0.1 \leq c \leq 0.5$.

6. The piezoceramic composition according to claim 1, wherein:

$0.005 \leq b \leq 0.15$.

7. The piezoceramic composition according to claim 1, wherein:

$0.001 \leq z \leq 0.05$.

8. The piezoceramic composition according to claim 1, wherein the rare earth metal RE being at least one metal selected from the group consisting of europium, gadolinium, lanthanum, neodymium, praseodymium, promethium and samarium.

9. The piezoceramic composition according to claim 1, wherein the alkaline earth metal AE being at least a metal selected from the group consisting of calcium, strontium and barium.

* * * * *

UNITED STATES PATENT AND TRADEMARK OFFICE
CERTIFICATE OF CORRECTION

PATENT NO. : 8,110,121 B2  
APPLICATION NO. : 12/094186  
DATED : February 7, 2012  
INVENTOR(S) : Francois Bamiere et al.

Page 1 of 1

It is certified that error appears in the above-identified patent and that said Letters Patent is hereby corrected as shown below:

On the title page, item 54 and col. 1, line 1, Title, "Lead Zirconate Titanate with Iron/Tungstein Doping, Method of Producing a Piezoceramic Material with the Lead Zirconate Titanate, and Use of the Piezoceramic Material" should read -- LEAD ZIRCONATE TITANATE WITH IRON/TUNGSTEN DOPING, METHOD OF PRODUCING A PIEZOCERAMIC MATERIAL WITH THE LEAD ZIRCONATE TITANATE, AND USE OF THE PIEZOCERAMIC MATERIAL --.

Signed and Sealed this
Fourteenth Day of August, 2012

David J. Kappos
*Director of the United States Patent and Trademark Office*